United States Patent [19]

Bechtolsheim et al.

[11] Patent Number: 5,270,964
[45] Date of Patent: Dec. 14, 1993

[54] SINGLE IN-LINE MEMORY MODULE

[75] Inventors: Andreas Bechtolsheim, Stanford; Edward Frank, Portola Valley; James Testa, Mountain View; Shawn Storm, Mt. View, all of Calif.

[73] Assignee: Sun Microsystems, Inc., Mountain View, Calif.

[21] Appl. No.: 886,413

[22] Filed: May 19, 1992

[51] Int. Cl.⁵ .............................................. G11C 13/00
[52] U.S. Cl. .................................... 365/52; 365/63; 439/326
[58] Field of Search ................ 365/52, 63; 439/328, 439/326, 636

[56] References Cited

U.S. PATENT DOCUMENTS

| | | | |
|---|---|---|---|
| 4,262,340 | 11/1979 | Sasaki et al. | 365/154 |
| 4,651,416 | 7/1985 | DePaul | 29/174 |
| 4,656,605 | 6/1986 | Clayton | 365/52 |
| 4,727,513 | 2/1987 | Clayton | 365/52 |
| 4,850,892 | 2/1988 | Clayton et al. | 439/326 |
| 4,879,631 | 1/1989 | Johnson et al. | 361/386 |
| 4,882,700 | 6/1988 | Mauritz et al. | 365/51 |
| 4,884,237 | 3/1989 | Mueller et al. | 365/63 |
| 4,891,789 | 3/1988 | Quattrini et al. | 361/409 |
| 4,990,107 | 11/1989 | Fortuna | 439/637 |
| 4,992,849 | 2/1989 | Corbett et al. | 357/72 |
| 4,992,850 | 2/1989 | Corbett et al. | 357/72 |
| 5,026,297 | 6/1990 | Krehbiel | 439/326 |
| 5,051,994 | 4/1989 | Bluethman et al. | 371/11.1 |
| 5,094,624 | 6/1991 | Baake et al. | 439/326 |
| 5,112,242 | 11/1990 | Choy et al. | 439/326 |
| 5,126,910 | 5/1990 | Windsor et al. | 361/42 |
| 5,138,434 | 1/1991 | Corbett et al. | 357/74 |
| 5,145,396 | 11/1991 | Yeung | 439/326 |
| 5,157,635 | 7/1991 | Ellis et al. | 365/230 |
| 5,161,995 | 1/1992 | Baake et al. | 439/326 |
| 5,162,979 | 10/1989 | Anzelone et al. | 361/415 |
| 5,167,517 | 12/1991 | Long | 439/160 |

Primary Examiner—Terrell W. Fears
Attorney, Agent, or Firm—Blakely Sokoloff Taylor & Zafman

[57] ABSTRACT

A full width single in-line memory module (SIMM) for dynamic random access memory (DRAM) memory expansions is disclosed. A printed circuit board having a multiplicity of DRAM memory elements mounted thereto is arranged in a data path having a width of 144 bits. The SIMM of the present invention further includes on-board drivers to buffer and drive signals in close proximity to the memory elements. In addition, electrically conductive traces are routed on the circuit board in such a manner to reduce loading and trace capacitance to minimize signal skew to the distributed memory elements. The SIMM further includes a high pin density dual read-out connector structure receiving electrical traces from both sides of the circuit board for enhanced functionality. The SIMM is installed in complementary sockets one SIMM at a time to provide memory expansion in full width increments. Finally, symmetrical power and ground routings to the connector structure insure that the SIMM cannot be inserted incorrectly, wherein physically reversing the SIMM in the connector slot will not reverse power the SIMM.

8 Claims, 6 Drawing Sheets

| D< 0>  | D< 0>  | D< 32> | D< 32> |
|--------|--------|--------|--------|
| D< 1>  | D< 1>  | D< 33> | D< 33> |
| D< 2>  | D< 2>  | D< 34> | D< 34> |
| D< 3>  | D< 3>  | D< 35> | D< 35> |
| D< 4>  | D< 4>  | D< 36> | D< 36> |
| D< 5>  | D< 5>  | D< 37> | D< 37> |
| D< 6>  | D< 6>  | D< 38> | D< 38> |
| D< 7>  | D< 7>  | D< 39> | D< 39> |
| D< 8>  | D< 8>  | D< 40> | D< 40> |
| D< 9>  | D< 9>  | D< 41> | D< 41> |
| D< 10> | D< 10> | D< 42> | D< 42> |
| D< 11> | D< 11> | D< 43> | D< 43> |
| D< 12> | D< 12> | D< 44> | D< 44> |
| D< 13> | D< 13> | D< 45> | D< 45> |
| D< 14> | D< 14> | D< 46> | D< 46> |
| D< 15> | D< 15> | D< 47> | D< 47> |
| D< 16> | D< 16> | D< 48> | D< 48> |
| D< 17> | D< 17> | D< 49> | D< 49> |
| D< 18> | D< 18> | D< 50> | D< 50> |
| D< 19> | D< 19> | D< 51> | D< 51> |
| D< 20> | D< 20> | D< 52> | D< 52> |
| D< 21> | D< 21> | D< 53> | D< 53> |
| D< 22> | D< 22> | D< 54> | D< 54> |
| D< 23> | D< 23> | D< 55> | D< 55> |
| D< 24> | D< 24> | D< 56> | D< 56> |
| D< 25> | D< 25> | D< 57> | D< 57> |
| D< 26> | D< 26> | D< 58> | D< 58> |
| D< 27> | D< 27> J0301 | D< 59> | D< 59> |
| D< 28> | D< 28> | D< 60> | D< 60> |
| D< 29> | D< 29> | D< 61> | D< 61> |
| D< 30> | D< 30> | D< 62> | D< 62> |
| D< 31> | D< 31> | D< 63> | D< 63> |
| CBW< 0> | CBW< 0> | CBW< 4> | CBW< 4> |
| CBW< 1> | CBW< 1> | CBW< 5> | CBW< 5> |
| CBW< 2> | CBW< 2> | CBW< 6> | CBW< 6> |
| CBW< 3> | CBW< 3> | CBW< 7> | CBW< 7> |
| ROE*   | ROE*   | BUSY*  | BUSY*  |
| VIRQ*  | VIRQ*  | SIRQ*  | SIRQ*  |
| RAS1*  | RAS1*  | RAS0*  | RAS0*  |
| CAS1*  | CAS1*  | CAS0*  | CAS0*  |
| A< 1>  | A< 1>  | A< 0>  | A< 0>  |
| A< 3>  | A< 3>  | A< 2>  | A< 2>  |
| A< 5>  | A< 5>  | A< 4>  | A< 4>  |

CONN2000

*Figure 4a*

| | | | |
|---|---|---|---|
| A< 7> | A< 7> | A< 6> | A< 6> |
| A< 9> | A< 9> | A< 8> | A< 8> |
| A< 11> | A< 11> | A< 10> | A< 10> |
| MEMRESET* | MEMRESET* | WE* | WE* |
| IOSEL* | IOSEL* | MCLK | MCLK |
| D< 64> | D< 64> | D< 96> | D< 96> |
| D< 65> | D< 65> | D< 97> | D< 97> |
| D< 66> | D< 66> | D< 98> | D< 98> |
| D< 67> | D< 67> | D< 99> | D< 99> |
| D< 68> | D< 68> | D< 100> | D< 100> |
| D< 69> | D< 69> | D< 101> | D< 101> |
| D< 70> | D< 70> | D< 102> | D< 102> |
| D< 71> | D< 71> | D< 103> | D< 103> |
| D< 72> | D< 72> | D< 104> | D< 104> |
| D< 73> | D< 73> | D< 105> | D< 105> |
| D< 74> | D< 74> | D< 106> | D< 106> |
| D< 75> | D< 75> | D< 107> | D< 107> |
| D< 76> | D< 76> | D< 108> | D< 108> |
| D< 77> | D< 77> | D< 109> | D< 109> |
| D< 78> | D< 78> | D< 110> | D< 110> |
| D< 79> | D< 79> | D< 111> | D< 111> |
| D< 80> | D< 80> | D< 112> | D< 112> |
| D< 81> | D< 81> | D< 113> | D< 113> |
| D< 82> | D< 82> | D< 114> | D< 114> |
| D< 83> | D< 83> | D< 115> | D< 115> |
| D< 84> | D< 84> | D< 116> | D< 116> |
| D< 85> | D< 85> | D< 117> | D< 117> |
| D< 86> | D< 86> | D< 118> | D< 118> |
| D< 87> | D< 87> | D< 119> | D< 119> |
| D< 88> | D< 88> | D< 120> | D< 120> |
| D< 89> | D< 89> | D< 121> | D< 121> |
| D< 90> | D< 90> | D< 122> | D< 122> |
| D< 91> | D< 91> | D< 123> | D< 123> |
| D< 92> | D< 92> | D< 124> | D< 124> |
| D< 93> | D< 93> | D< 125> | D< 125> |
| D< 91> | D< 91> | D< 126> | D< 126> |
| D< 92> | D< 92> | D< 127> | D< 127> |
| CBW< 8> | CBW< 8> | CBW< 12> | CBW< 12> |
| CBW< 9> | CBW< 9> | CBW< 13> | CBW< 13> |
| CBW< 10> | CBW< 10> | CBW< 14> | CBW< 14> |
| CBW< 11> | CBW< 11> | CBW< 15> | CBW< 15> |

*Figure 4b*

SINGLE IN-LINE MEMORY MODULE

BACKGROUND OF THE INVENTION

1. Related Applications

This application is related to U.S. patent application Ser. No. 07/795,699, entitled "High-Speed Electrical Signal Interconnect Structure", filed Nov. 21, 1991, and U.S. patent application Ser. No. 07/886,671, entitled "Bus Architecture for Integrated Data and Video Memory", filed concurrently herewith.

2. Field of the Invention

The present invention relates to the field of computer systems and memory hardware. More particularly, the present invention relates to modular circuit boards which may be combined to form a memory structure within a computer system.

3. Art Background

Single In-Line Memory Modules ("SIMMs") are compact circuit boards designed to accommodate surface mount memory chips. SIMMs were developed to provide compact and easy to manage modular memory components for user installation in computer systems designed to accept such SIMMs. SIMMs generally are easily inserted into a connector within the computer system, the SIMM thereby deriving all necessary power, ground, and logic signals therefrom.

A SIMM typically comprises a multiplicity of random access memory ("RAM") chips mounted to a printed circuit board. Depending on the user's needs, the RAM memory chips may be dynamic RAM (DRAM), non volatile static RAM (SRAM) or video RAM (VRAM). Because DRAM memories are larger and cheaper than memory cells for SRAMs, DRAMs are widely used as the principal building block for main memories in computer systems. SRAM and VRAM SIMMs have more limited application for special purposes such as extremely fast cache memories and video frame buffers, respectively. Because DRAMs form the largest portion of a computer system memory, it is therefore desirable that memory modules flexibly accommodate the computation needs of a user as the users' requirements change over time. Moreover, it is desirable that if the SIMM modules may be added to the computer system with a minimum user difficulty, specifically in terms of configuration of a SIMM within a particular memory structure. In the past, SIMMs have generally been designed to provide memory increments of one or more megabytes (MB), but where the memory addition comprises only a portion of the full data path used in the computer system. A leading example of the prior art organization and structure is that disclosed in U.S. Pat. No. 4,656,605, issued Apr. 7, 1987 to Clayton. Clayton discloses a compact modular memory circuit board to which are mounted nine memory chips which are arranged to provide memory increments in eight bit (one byte) data widths, plus parity bits. Thus, because most computer systems use data paths of 32, 64 or more bits, the SIMM constructed according to Clayton cannot provide a memory increment for the entire data path. Instead the user must obtain and install multiple SIMMs, in combination with performing any additional configuration requirements necessary to make the separate SIMMs modules function as a single memory unit, such as setting base addresses for the SIMM modules installed.

As a result, a user seeking to increase his usable main memory by adding SIMMs constructed according to the prior art, typically must insert multiple SIMMs to achieve a memory expansion for the entire data path of his computer. The foregoing is a consequence of typical prior art SIMM architecture, wherein the SIMM is arranged around DRAM parts which comprise one byte wide memory increments. Thus in a data path having a width of 32 bits, there being eight bits per byte, a 1 megabyte expansion of main memory using SIMMs constructed according to the prior art would require four SIMM modules each of one megabyte capacity in order to obtain a full data path expansion of one megabyte.

As will be described in more detail in the following detailed description, the present invention provides, among other attributes, facility for providing memory expansion in full data path widths, thereby relieving the user of configuring and installing multiple SIMMs modules to obtain any desired memory increment.

SUMMARY OF THE INVENTION

A full width single in-line memory module (SIMM) for dynamic random access memory (DRAM) memory expansions is disclosed. A printed circuit board having a multiplicity of DRAM memory elements mounted thereto is arranged in a data path having a width of 144 bits. The SIMM of the present invention further includes on-board drivers to buffer and drive signals in close proximity to the memory elements. In addition, electrically conductive traces are routed on the circuit board in such a manner to reduce loading and trace capacitance to minimize signal skew to the distributed memory elements. The SIMM further includes a high pin density dual read-out connector structure receiving electrical traces from both sides of the circuit board for enhanced functionality. The SIMM is installed in complementary sockets one SIMM at a time to provide memory expansion in full width increments. Finally, symmetrical power and ground routings to the connector structure insure that the SIMM cannot be inserted incorrectly, wherein physically reversing the SIMM in the connector slot will not reverse power the SIMM.

BRIEF DESCRIPTION OF THE DRAWINGS

The objects, features and advantages of the present invention will be apparent from the following detailed description given below and from the accompanying drawings of the preferred embodiment of the invention in which:

FIG. 4 is a connector diagram illustrating the data, address and control signals routed to the SIMM.

DETAILED DESCRIPTION OF THE INVENTION

A bus architecture for integrated data and video memory is disclosed. In the following description, for purposes of explanation, specific numbers, times, signals etc., are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

The preferred embodiment of the SIMM described herein is designed and intended to be used with the integrated data and video memory bus disclosed in copending U.S. patent application Ser. No. 07/886,671 filed May 19, 1992 entitled "A Bus Architecture For Integrated Data and Video Memory".

It will be apparent, however, to those skilled in the art that the specifications disclosed herein can or may be changed without departing from the scope of the present invention. Although the preferred embodiment of the present invention is disclosed in terms of the data path width matching that of the integrated data and video memory bus disclosed in the above-referenced U.S. Patent Application, it will be appreciated that changing the design of the bus is within the scope of the present invention, wherein the SIMM may be matched to the data path width of the integrated memory bus.

Figure 1A:
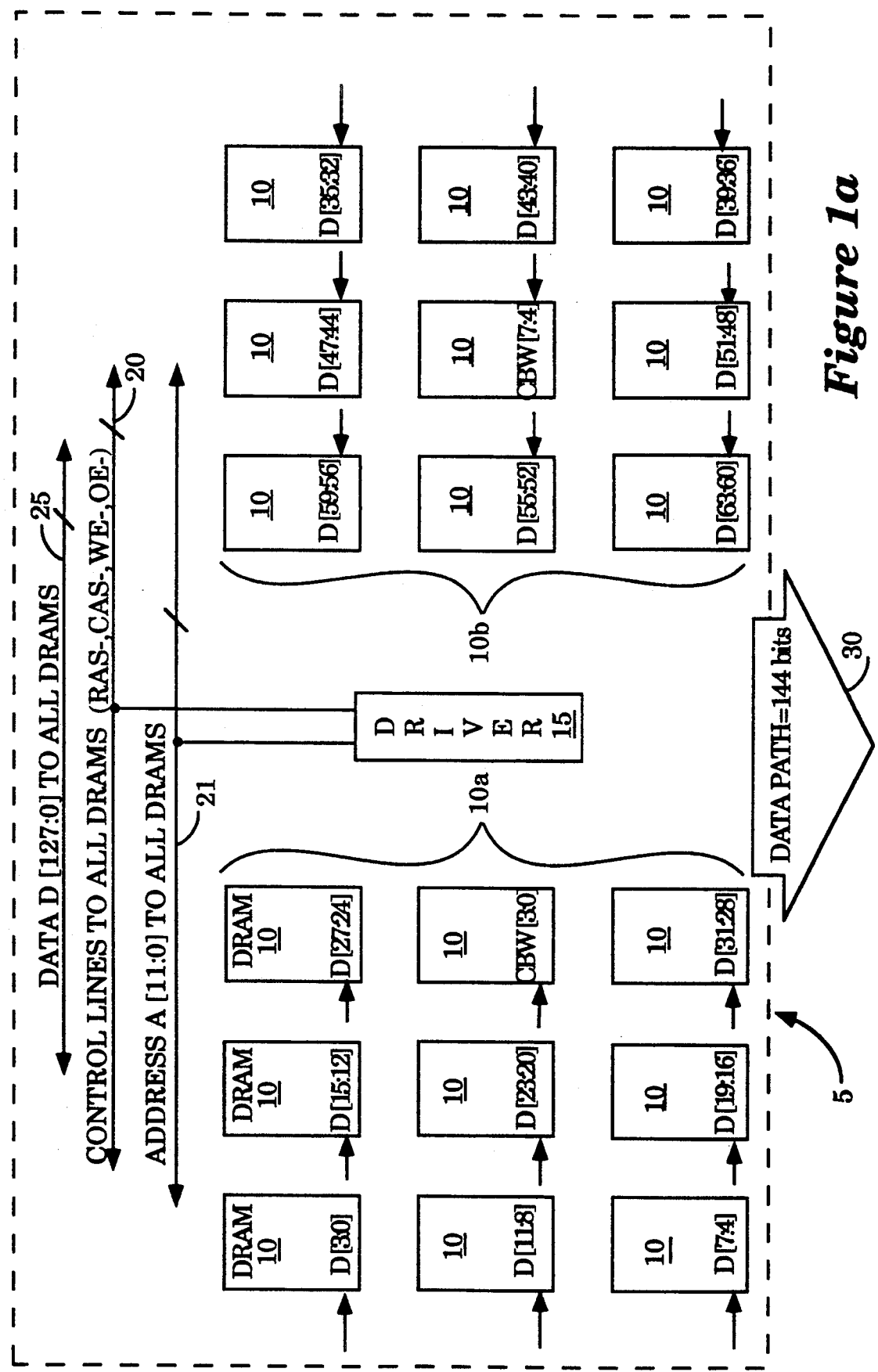
FIG. 1a illustrates the electrical schematic of a first side of the single in-line memory module (SIMM) according to the teachings of the present invention.

Reference is now made to FIG. 1a wherein an electrical block diagram of memory elements mounted to a first, obverse side of the SIMM is shown. In FIG. 1a, a multiplicity of dynamic RAM (DRAMs) 10 are grouped into two clusters 10a and 10b. There are nine DRAMs 10 in each cluster. A driver 15 receives control signals, and address signals from an external bus arrangement (not shown) through a dual sided connector 30. A multiplicity of control lines 20 route RAS-(row access strobe), CAS-(column access strobe), WE-(write enable), and OE-(output enable), control signals from driver 15 to all the DRAMs 10 mounted to SIMM 5. Moreover, driver 15 buffers and subsequently distributes address signals 21 to all DRAMs 10 mounted to SIMM 5. For purposes of clarity in the present figure, the specific routing of data, address and control lines to all the DRAMs 10 is omitted. However, as can be seen from FIG. 1a, all DRAMs 10 have four data lines, DRAMs 10 being any of several commercially available DRAMs arranged in a "by-four" configuration. As will be seen below in connection with FIG. 1b, DRAMs 10 each of DRAM clusters 10a and 10b are matched with mirror image DRAMs 10 mounted to the opposite side of SIMM 5 and placed in electrical communication by electrical traces passing through a multiplicity of vias (not shown).

The specific routing of the electrical traces on SIMM 5 are dependent upon the specific architecture of the memory chips chosen for a specific implementation of SIMM 5. However, all SIMMs 5 constructed according to the teachings of the present invention have a full width data path extending from connector 30 to all devices operating on SIMM 5, including all DRAMs 10, driver 15, and any other logic elements necessary to implement the desired function of SIMM 5. As presently preferred, SIMM 5 embodies a 144 bit data path, comprising 128 data lines (DATA[127:0]), 16 error correction lines (CBW[15:0]) which implement a known error correction code, one RAS-, two CAS-signals, one WE signal and one reset line. The routing for all control signals 20, address signals 21 and data signals 25 minimize conductive trace capacitance and loading in accordance with above referenced U.S. Pat. Appl. entitled "High Speed Electric Signal Interconnect Structure," assigned to the assignee of the present invention, and which is incorporated herein by reference. The trace routing control for all signals 20 are taken from driver 15 to the central DRAM 10 for each DRAM cluster 10a, 10b, 10c, and 10d. DRAMs surrounding the central DRAM 10 are coupled to control signals 20 via short sub traces (not shown), thereby minimizing total capacitance, and increasing signal rise times.

Figure 3:
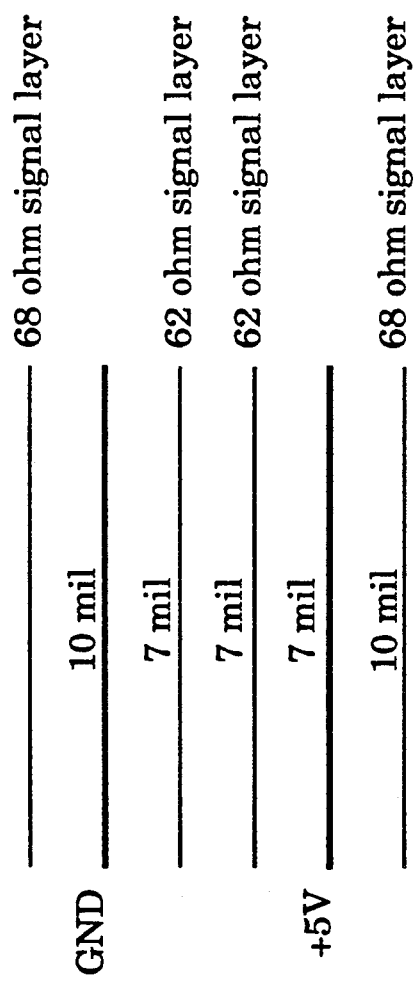
FIG. 3 illustrates the stacked conductive layers separated by insulating dielectric necessary to build up the interconnections for the electrical schematic shown in FIGS. 1a and 1b.

With brief reference to FIG. 3, the stack up used to route all control, addresses, data, and power and ground signals is illustrated.

Figure 1B:
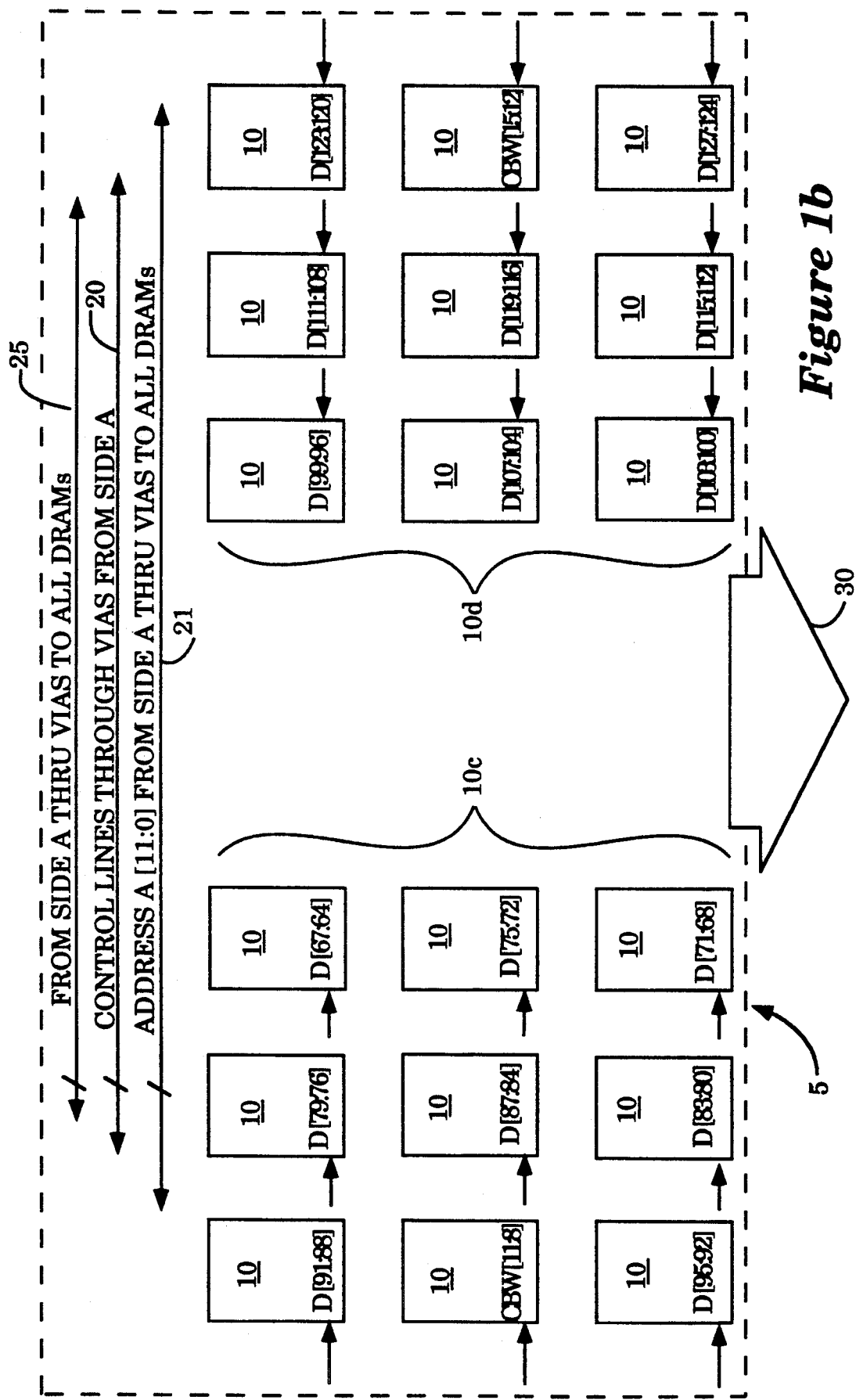
FIG. 1b illustrates the electrical schematic for a left-to-right mirror image layout of memory elements on a second side of the SIMM.

With brief reference to FIG. 1b, a second, reverse side of SIMM 5 is shown. In FIG. 1b, two additional DRAM clusters 10c and 10d are shown arranged as DRAM clusters 10a and 10b on the observe side. Each DRAM 10 in DRAM clusters 10c and 10d similarly receives four input lines in addition to address and control lines passed from driver 15 on the obverse side through conductive vias to the mirror image reverse side of SIMM 5., thereby doubling the available surface area to which DRAMs 10 may be mounted. Moreover, SIMM 5 as presently preferred utilized thin small outline package (TSOP) DRAMs 10 to reduce overall thickness of SIMMs 5. When thus constructed, the double sided SIMM 5 of the present invention is no thicker than prior art single sided SIMMs (e.g., as taught by Clayton).

Briefly referring to FIG. 4, the high number density connector 30 used to connect SIMM 5 to the memory module socket (not shown) is illustrated. In FIG. 4, connector 30 is seen to have 200 pin terminations, therefore permitting a large number of signals to be routed to and from SIMM 5. In the preferred embodiment of SIMM 5, it is intended that SIMM 5 specifically incorporate the data path architecture consistent with an integrated data and video memory bus such as that described in above referenced copending U.S. Patent Applications assigned to Sun Microsystems, Inc., Mountain View, Calif., which is hereby incorporated herein by reference. In particular, the data path architecture implemented on SIMM 5 includes 128 data lines, 16 error correction code lines (referred to CBW [15:0] in FIGS. 1–6), in addition to a multiplicity of control signals necessary to accomplish DRAM memory accesses. Such control signals, collectively referred to control lines 20 in FIGS. 1a and 1b, include one RAS- per SIMM 5, two CAS-signals, one WE-, and one reset line. Thus, not including the control signals 20 which are used for controlling operation of DRAMs 10, the data path used for transmission of data to and from DRAMs 10 is seen to be 144 bites wide. Disregarding the error correction code signals, referred to in FIGS. 1–6 as CBW [15:0], the actual data path width of SIMM 5 for writing and reading data to and from memory is 128 bits wide, or 16 bytes, identical to that of the integrated data and video memory bus. Accordingly, SIMM5 of the present invention may be installed into the memory bus in full width increments.

A total memory capacity available on a SIMM 5 may be computed as follows. Depending on the capacity of each RAM 10 mounted to SIMM 5 the total memory capacity of each SIMM module 5 can vary from four megabytes (MB) to a maximum of sixty-four MB, distributed over a total of thirty-six DRAMs 10. Using commercially available 256K×4.1 Mbit DRAMs 10, four megabytes of memory may be provided on SIMM 5. Alternatively, when 16 megabit parts become available, because the addressable address space of SIMM 5 is very large, greater than two gigabits, SIMM 5 can easily accommodate the higher 16 megabit parts and make available a total capacity of 64 megabytes on a SIMM 5 having 36 DRAMs mounted to it.

Operation of SIMM 5 is controlled by control signals 20 as will be briefly discussed below. For a complete discussion on the actual operation of SIMM 5 in connection with the integrated data and video bus, the reader is referred to the above copending U.S. Patent Application, entitled "A Bus Architecture".

Figure 2A:
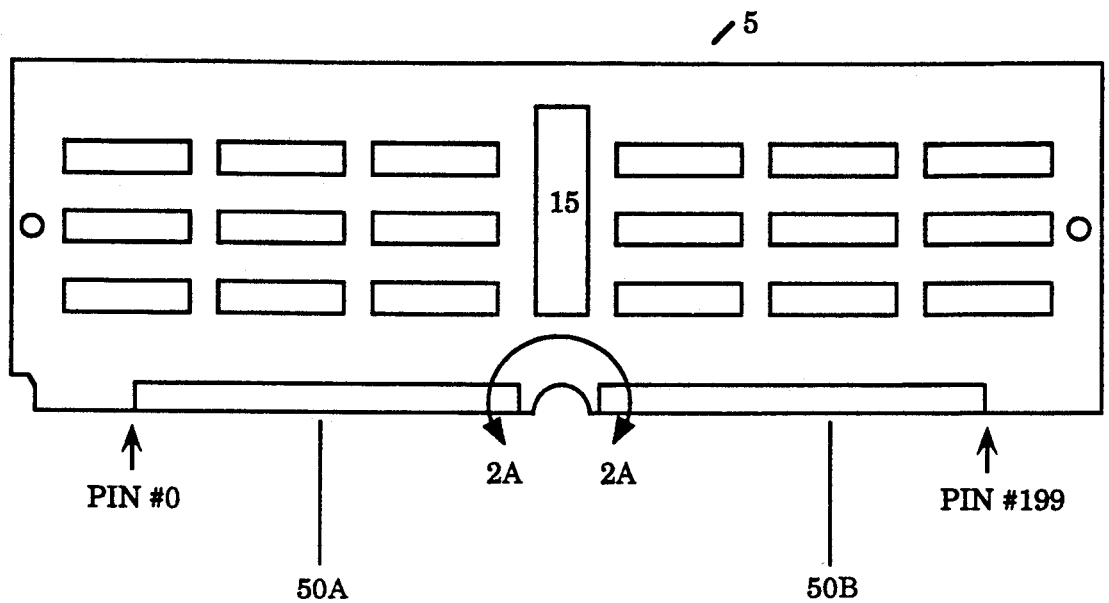
FIG. 2a illustrates the physical layout of the memory elements and drivers placed on the SIMM.
Figure 2B:
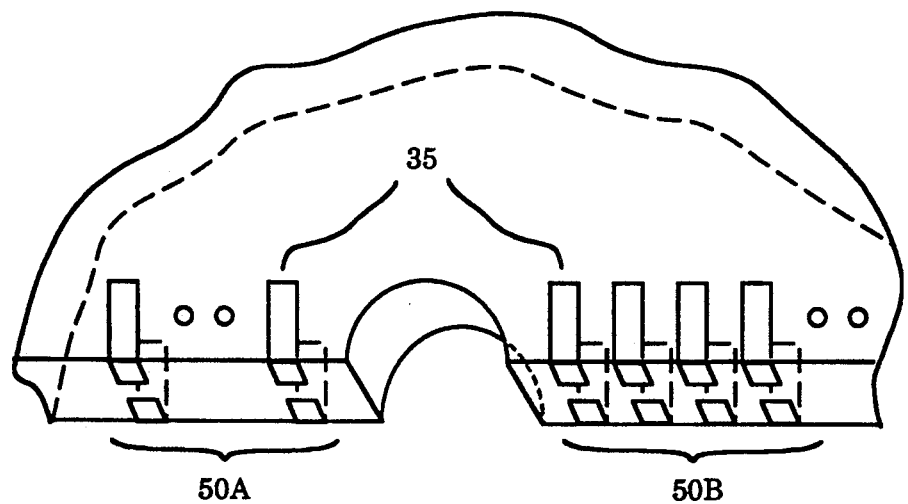
FIG. 2b is a magnified view of the dual read-out connector structure on the SIMM.

Reference is now made to FIG. 2, wherein the physical arrangement of DRAMs 10 and driver 15 are illustrated on SIMM 5. In addition to the DRAM clusters 10a and 10b shown on the obverse side of SIMM 5, the SIMM 5 is noted to have two contact regions 50a and 50b on the lower edge of SIMM 5. Contact regions 50a and 50b consist of narrowly spaced conductive contact pads running longitudinally across the bottom edge of SIMM 5 from pin 0 to pin 199, corresponding in number to the connector map illustrated in FIGS. 4a and 4b and the pinout summary.

TABLE 1
SIMM Pin Descriptions

| Pin | Descriptions |
|---|---|
| D<0–127> | Data Bits |
| A<0–11> | Address Bits |
| CBW<0–7> | Check Bit Write Enables/data bus to on board devices used in Video SIMM |
| CBW<8–5> | Check Bit Write Enables |
| CAS<0–1>* | Column Address Strobes |
| RAS<0–1>* | Row Address Strobes |
| BUSY* | Video Frame Buffer Busy Signal - indicates that frame buffer is busy doing refresh or reload operations |
| SIRQ* | UART Interrupt |
| VIRQ* | Video Interrupt |
| WE* | Write Enable |
| MRST* | Reset Signal |
| MCLK | MBus Clock - Sent to the VBC |
| IOSEL* | Differentiates between memory address space and I/O address space |
| ROE* | Currently used by VSIMM to generate DTOE signals. OE* on the DSIMMs is tied to Ground. |

In FIG. 2, a detail of the bottom edge of SIMM 5 is shown in FIG. 2a, a magnified view of the contact region of contact regions 50a and 50b are shown in perspective view. In FIG. 2a, it is seen that contact regions 50a and 50b consist of a large number of closely spaced contact pads 35 on the obverse side of SIMM 5 and a mirror image yet electrically distinct set of contact pads 36 on the reverse side of SIMM 5. In contrast to SIMMs constructed according to the prior art, the SIMM 5 of the present invention doubles the pinout capacity of a SIMM by "breaking" the connection between the obverse and reverse sides of SIMM 5, thereby effectively doubling the edge area which may be dedicated to electrical functions. For purposes of clarity, in contrast to prior art SIMM modules having contact pins placed on 0.1" centers, the spacing of contacts 35 and 36 on SIMM 5 are placed on 0.050" centers, the contact pads 35 and 36 themselves being 0.040" in lateral dimension thereby yielding a space of 0.010" between contact pads. However, the precise spacing and dimensions is not specific to the present invention, and it will be obvious to those skilled in the art that numerous spacing and pad placement schemes are possible using the "dual read out" arrangement as illustrated in FIG. 2a in contact regions 50a and 50b. Thus, operating together, the reduced spacing and dual readout arrangement of contact regions 50a and 50b provide a vastly improved pinout density available for SIMM modules, over four times that suggested by Clayton. In particular, because 200 pins are available for use on SIMM 5, the full data path width of 144 bits in addition to control signals and power and ground connections is accommodated by connector 30 and connector regions 50a and 50b of SIMM 5.

As previously noted in connection with the memory capacities according to the type of DRAM 10 installed on SIMM 5, it should be appreciated that the principal benefit of SIMM 5 constructed according to the teachings of the present invention is that memory expansion may be accommodated in full data path width increments. In contrast to memory expansion using SIMMs of the prior art, use of SIMM 5 in expanding memory, especially memory in association with integrated data and video memory of the above referenced copending application, memory may be expanded one SIMM at a time, and does not require multiple modules to be inserted to gain a single increment in memory expansion. The above result is principally derived from the accommodation of a full data path signal path on SIMM 5, thus facilitating easy installation of additional memory.

Finally, connector 30 further provides for power and ground to be connected to all DRAMs 10 and driver 15. Notably, all power and ground leads are symmetrically arranged within Connector 30, as is more clearly seen in Table 2 illustrated below.

TABLE 2

| base | +1 | +2 | +3 | +4 | +5 | +6 | +7 | +8 |
|---|---|---|---|---|---|---|---|---|
| 0 | GND | GND | D0 | D7 | D1 | D6 | D2 | D5 |
| 8 | D3 | D4 | D32 | D39 | D33 | D38 | D34 | D37 |
| 16 | VCC | VCC | D35 | D36 | D8 | D15 | D9 | D14 |
| 24 | D10 | D13 | D11 | D12 | D40 | D47 | D41 | D46 |
| 32 | GND | GND | D42 | D45 | D43 | D44 | D16 | D23 |
| 40 | D17 | D22 | D18 | D21 | D19 | D20 | D48 | D55 |
| 48 | VCC | VCC | D49 | D54 | D50 | D53 | D51 | D52 |
| 56 | D24 | D31 | D25 | D30 | D26 | D29 | D27 | D28 |
| 64 | GND | GND | D56 | D63 | D57 | D62 | D58 | D61 |
| 72 | D59 | D60 | CBW0 | CBW7 | CBW1 | CBW6 | CBW2 | CBW5 |
| 80 | VCC | VCC | CBW3 | CBW4 | −CAS0 | −CAS1 | −RAS0 | −RAS1 |
| 88 | −ROE | −BUSY | −VIRQ | −SIRQ | A0 | A1 | A2 | A3 |
| 96 | A4 | A5 | GND | GND | GND | GND | A6 | A7 |
| 104 | A8 | A9 | A19 | A11 | −MRST | −WE | −IOSEL | MCLK |
| 112 | GND | GND | GND | GND | CBW8 | CBW15 | VCC | VCC |
| 120 | CBW9 | CBW14 | CBW10 | CBW13 | CBW11 | CBW12 | D64 | D71 |

TABLE 2-continued

| base | +1 | +2 | +3 | +4 | +5 | +6 | +7 | +8 |
|---|---|---|---|---|---|---|---|---|
| 128 | D65 | D70 | D66 | D69 | D67 | D68 | GND | GND |
| 136 | D96 | D103 | D97 | D102 | D98 | D101 | D99 | D100 |
| 144 | D72 | D79 | D73 | D78 | D74 | D77 | VCC | VCC |
| 152 | D75 | D76 | D104 | D111 | D105 | D110 | D106 | D109 |
| 160 | D107 | D108 | D80 | D87 | D81 | D86 | GND | GND |
| 168 | D82 | D85 | D83 | D84 | D112 | D119 | D113 | D118 |
| 176 | D114 | D117 | D115 | D116 | D88 | D95 | VCC | VCC |
| 184 | D89 | D94 | D90 | D93 | D91 | D92 | D120 | D127 |
| 192 | D121 | D126 | D122 | D125 | D123 | D124 | GND | GND |

Power (VCC) and ground (GND) leads are seen to alternate every sixteen pins. If a SIMMS were inadvertently inserted in a reversed position into a memory module socket, the symmetrical power ground leads prevent the SIMM 5 from being reverse-powered, and likely destroyed.

The foregoing has described a physical architecture for a single in-line memory module compatible with an integrated data and video memory. It is contemplated that changes and modifications may be made by one or ordinary skill in the art, to the device components and arrangements of the elements of the present invention without departing from the spirit and scope of the invention. In particular, it is anticipated that SIMM 5 may be used with memory arrangements other than the integrated data and video memory incorporated by reference from the above-referenced copending application. However, SIMM 5 is optimally designed for use in the integrated video memory, and the user would derive optimal benefit from use in such a system.

While the invention has been described in conjunction with the preferred embodiment, it is evident that numerous alternative modifications, variations and uses will be apparent to those skilled in the art in light of the foregoing description.

We claim:

1. A single in-line memory module, said single in-line memory module comprising the elements of:
   a printed circuit board, said printed circuit board having a first side and a second side, said printed circuit board having a connector edge, said connector edge having a plurality of electrical contacts on said first side and said second side of said printed circuit board;
   a first set of memory elements arranged on the first side of said printed circuit board, said first memory elements having data lines coupled to said electrical contacts on said connector edge of said printed circuit board;
   a second set of memory elements arranged on the second side of said printed circuit board, said second memory elements having data lines coupled to said electrical contacts on said connector edge of said printed circuit board, said second set of memory elements being mirror images of said first set of memory elements;
   a driver circuit mounted substantially centered on said printed circuit board, said driver circuit receiving a plurality of control signals through said electrical contacts, said driver circuit transmitting said control signals to said first set of memory elements and said second set of memory elements.

2. A single in-line memory module as claimed in claim 1 wherein:
   said first set of memory elements arranged on the first side of said printed circuit board comprises a first subset arranged to the left of said driver circuit and a second subset arranged to the right of said driver circuit; and
   said second set of memory elements arranged on the second side of said printed circuit board comprises a third subset being mirror image of said first subset and a fourth subset being mirror image of said second subset.

3. A single in-line memory module as claimed in claim 2 wherein said first, second, third, and fourth subsets of memory elements comprise nine memory elements arranged in a three by three matrix.

4. A single in-line memory module as claimed in claim 3 wherein said driver circuit transmits said control signals directly to a center memory element in the three by three matrix of said first and second memory element subsets.

5. A single in-line memory module as claimed in claim 1 wherein said control signals comprise column address strobe (CAS), row address strobe (RAS), write enable (WE), and output enable (OE) signals.

6. A single in-line memory module as claimed in claim 5 wherein said driver circuit further drives address lines.

7. A single in-line memory module as claimed in claim 1 wherein said electrical contacts have symmetrical power and ground contacts such that said single in-line memory module is not damaged if said single in-line memory module is inserted incorrectly.

8. A single in-line memory module as claimed in claim 1 wherein said single in-line memory module provides data in a first data path at least as wide a second data path used an associated central processing unit.

* * * * *

Disclaimer 5,270,964—Andreas Bechtolsheim, Stanford; Edward Frank, Portola Valley; James Testa, Mountain View; Shawn Storm, Mt. View, all of Calif. SINGLE IN-LINE MEMORY MODULE. Patent dated December 14, 1993. Disclaimer filed May 21, 2001, by the assignee, Sun Microsystems Inc.

Hereby enters this disclaimer to all claims of said patent.
*(Official Gazette, August 14, 2001)*